(12) United States Patent
Okutsu

(10) Patent No.: US 12,183,713 B2
(45) Date of Patent: Dec. 31, 2024

(54) SEMICONDUCTOR MODULE, METHOD FOR MANUFACTURING SAME, AND SEMICONDUCTOR MODULE MOUNTING BODY

(71) Applicant: UltraMemory Inc., Tokyo (JP)

(72) Inventor: Fumitake Okutsu, Tokyo (JP)

(73) Assignee: ULTRAMEMORY, INC., Tokyo (JP)

( * ) Notice: Subject to any disclaimer, the term of this patent is extended or adjusted under 35 U.S.C. 154(b) by 363 days.

(21) Appl. No.: 17/628,004

(22) PCT Filed: Jul. 18, 2019

(86) PCT No.: PCT/JP2019/028328
§ 371 (c)(1),
(2) Date: Jan. 18, 2022

(87) PCT Pub. No.: WO2021/009920
PCT Pub. Date: Jan. 21, 2021

(65) Prior Publication Data
US 2022/0271006 A1 Aug. 25, 2022

(51) Int. Cl.
*H01L 25/065* (2023.01)
*H01L 21/48* (2006.01)
(Continued)

(52) U.S. Cl.
CPC ...... *H01L 25/0652* (2013.01); *H01L 21/4857* (2013.01); *H01L 21/4882* (2013.01); *H01L 21/565* (2013.01); *H01L 23/3675* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 2224/16145* (2013.01); *H01L 2924/1431* (2013.01); *H01L 2924/1436* (2013.01)

(58) Field of Classification Search
None
See application file for complete search history.

(56) References Cited

U.S. PATENT DOCUMENTS 10,032,722 B2 * 7/2018 Yu .................. H01L 23/5383
10,510,674 B2 * 12/2019 Lin .................. H01L 24/92
(Continued)

FOREIGN PATENT DOCUMENTS

JP 11-67959 A 3/1999

*Primary Examiner* — Long Pham
(74) *Attorney, Agent, or Firm* — Muncy, Geissler, Olds & Lowe, P.C.

(57) ABSTRACT

A semiconductor module that enables reduction of manufacturing costs, a method for manufacturing the same, and a semiconductor module mounting body. The semiconductor module having a plurality of stacked dies includes: a first die; a second die disposed side by side with respect to the first die in a direction intersecting with a stacking direction; a third die disposed in the stacking direction, so as to straddle the first die and the second die and that is electrically connected to wiring surfaces of the first die and the second die opposing the third die; projection terminals projecting from the wiring surfaces of the first die and the second die and that project in a space adjacent to at least one of side surfaces of the third die in the direction intersecting with the stacking direction; and rewiring layers disposed so as to overlap with the projection terminals.

9 Claims, 10 Drawing Sheets

(51) Int. Cl.
H01L 21/56 (2006.01)
H01L 23/367 (2006.01)
H01L 23/498 (2006.01)
H01L 23/00 (2006.01)

(56) References Cited

U.S. PATENT DOCUMENTS

| | | | |
|---|---|---|---|
| 2015/0255411 A1* | 9/2015 | Karhade | H01L 24/81 |
| | | | 361/679.55 |
| 2017/0062383 A1* | 3/2017 | Yee | H01L 23/3675 |
| 2017/0345761 A1 | 11/2017 | Yu et al. | |
| 2018/0005984 A1* | 1/2018 | Yu | H01L 24/17 |
| 2021/0217715 A1* | 7/2021 | Yu | H01L 23/66 |

\* cited by examiner

SEMICONDUCTOR MODULE, METHOD FOR MANUFACTURING SAME, AND SEMICONDUCTOR MODULE MOUNTING BODY

TECHNICAL FIELD

The present disclosure relates to a semiconductor module, a method of manufacturing the same, and a mounting body of the semiconductor module.

BACKGROUND ART

Conventionally, volatile memory (RAM) such as DRAM (Dynamic Random Access Memory) as a storage device is known. In DRAM, high-performance arithmetic units (hereinafter referred to as logical chips) and large-capacity capable of withstanding an increase in the amount of data are required. Therefore, reduction in size of memory devices (memory cell arrays and memory chips) and increase in capacity owing to planar expansion of cells have been attempted. However, due to weakness to noise caused by the reduction in size and the increase in die area, for example, such increase in capacity has reached a limit.

Recently, a technique has been developed in which a plurality of planar memory devices are stacked and three-dimensionalized (3D) to realize large-capacity memory. In addition, there has been proposed a semiconductor module in which a plurality of chips are arranged in an overlapping manner to reduce a footprint of the plurality of chips (for example, refer to Patent Document 1).

Patent Document 1: U.S. Published Patent Application Publication, No. 2015/0255411, Specification

DISCLOSURE OF THE DISCLOSURE

Problems to be Solved by the Disclosure

In Patent Document 1, a second chip having an exposed active surface is disposed on a first surface of a package substrate. Furthermore, in Patent Document 1, the first chip is disposed such that the active surface faces the first surface of the package substrate and the active surface of the second chip. In addition, in Patent Document 1, the first chip is electrically connected to the first surface of the package substrate and the active surface of the second chip.

As described above, the semiconductor module disclosed in Patent Document 1 can have a large capacity. On the other hand, in the semiconductor module disclosed in Patent Document 1, since a package substrate is used, the manufacturing cost is relatively high. Therefore, it is more preferable to reduce the manufacturing cost.

Exemplary embodiments of the present disclosure provide a semiconductor module that allows for reduction in manufacturing cost, a method of manufacturing the same, and a mounting body of the semiconductor module.

Means for Solving the Problems

An exemplary embodiment of the present disclosure provides a semiconductor module including a plurality of stacked dies, including: a first die; a second die provided side by side with the first die in a direction intersecting a stacking direction; a third die that extends over the first die and the second die in the stacking direction, and is electrically connected to wiring surfaces of the first die and the second die opposite to the third die; at least one projecting terminal which projects from the wiring surfaces of the first die and the second die, and projects in a spatial region adjacent to at least one side surface of the third die in a direction intersecting the stacking direction, and a rewiring layer which overlaps the projecting terminal.

Furthermore, it is preferable that the second die is a power supply die that supplies the third die with power supplied from the projecting terminal.

Furthermore, it is preferable that the second die includes a plurality of second dies, and the second dies are provided in a pair with the first die interposed therebetween in a direction intersecting the stacking direction, and the third die includes a plurality of third dies, and the third dies are provided in a pair, each of which extends over the first die and one of the paired second dies.

Furthermore, it is preferable that the third die includes an array portion which overlaps the second die in the stacking direction, and an interface unit which overlaps the first die in the stacking direction.

Furthermore, it is preferable that the semiconductor module further includes a heat dissipating portion that overlaps the third die, and serves as a heat dissipating path of the third die.

Furthermore, it is preferable that the semiconductor module further includes a plurality of external terminals provided side by side with the rewiring layer in the stacking direction, the plurality of external terminals including a connection terminal which is electrically connected to the projecting terminal via the rewiring layer, and a non-connection terminal which is provided at a position overlapping the third die in the stacking direction and is not electrically connected to the projecting terminal.

Furthermore, it is preferable that the heat dissipating portion includes an overlapping portion, which overlaps the third die, of the rewiring layer, and the non-connection terminal.

Furthermore, it is preferable that the overlapping portion includes metal layers stacked discontinuously, and at least one heat dissipating via connecting between the metal layers which are adjacent.

Furthermore, it is preferable that the heat dissipating portion includes a heat dissipating member penetrating the rewiring layer.

An exemplary embodiment of the present disclosure further provides a mounting body of a semiconductor module including a semiconductor module according to the above configuration, and a mounting substrate including a plurality of through terminals penetrating in a stacking direction and each connected to at least one external terminal.

An exemplary embodiment of the present disclosure further provides a method of manufacturing a semiconductor module including a plurality of stacked dies, the method including the steps of: forming at least one projecting terminal on one surface of each of a first die and a second die; providing the first die and the second die side by side on a support substrate; providing a third die so as to extend over the first die and the second die; molding the first die, the second die, the third die, and the projecting terminal; forming a rewiring layer which extends over an exposed surface of the third die, and is electrically connected to the projecting terminal; and removing the support substrate.

Furthermore, it is preferable that the step of providing the first die and the second die side by side on the support substrate further includes a step of providing a plurality of sets of the first die and the second die.

Furthermore, it is preferable that the method further includes a step of polishing to cause the third die and the projecting terminal to be exposed, after the step of molding before the step of forming the rewiring layer.

Furthermore, it is preferable that the method further includes a step of providing a heat dissipating member penetrating the rewiring layer at a position overlapping the third die.

Effects of the Disclosure

According to the exemplary embodiments of the present disclosure, it is possible to provide a semiconductor module that allows for reduction in manufacturing cost, a method of manufacturing the same, and a mounting body of the semiconductor module.

PREFERRED MODE FOR CARRYING OUT THE DISCLOSURE

Figure 1:
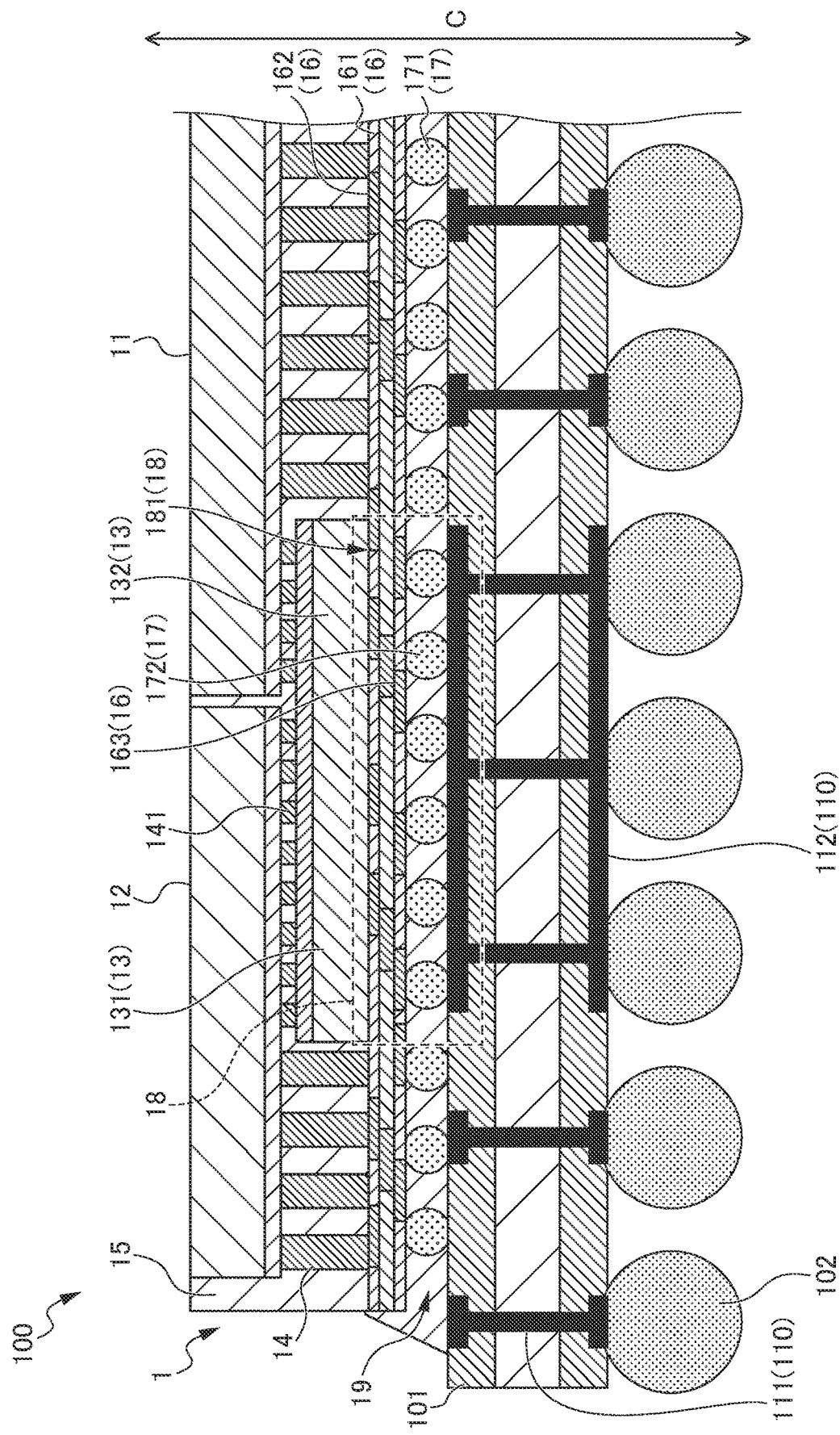
FIG. 1 is a schematic sectional view showing a semiconductor module and a mounting body of the semiconductor module according to a first exemplary embodiment of the present disclosure.

Hereinafter, a semiconductor module 1 according to each exemplary embodiment of the present disclosure, a manufacturing method thereof, and a mounting body 100 of the semiconductor module 1 will be described with reference to FIGS. 1 to 9. The semiconductor module 1 according to the respective embodiments is, for example, an SIP (system in a package) in which an arithmetic unit (first die 11, hereinafter referred to as a logical chip) and a RAM unit 13 serving as a RAM module including a single-layer or stacked RAM, are provided on a rewiring layer 16. Although not particularly limited, the semiconductor module 1 is disposed on a substrate (motherboard, etc., not shown) in the form of the mounting body 100 of the semiconductor module which is mounted on a mounting substrate 101 having solder balls 102. The electrical connection for the semiconductor module 1 is provided via the solder balls 102 (power source balls, etc.). Alternatively, the semiconductor module 1 may be disposed directly on the substrate without the mounting substrate 101 and the solder balls 102. The semiconductor module 1 can obtain power from the substrate, and can transmit and receive data with the substrate. Furthermore, in each of the following exemplary embodiments, the thickness direction (height direction) of the semiconductor module 1 is described as a thickness direction C. Furthermore, the side on which the substrate is provided in the thickness direction C of the semiconductor module 1 is described as a lower side. The side on which the first die 11 is provided in the thickness direction C of the semiconductor module 1 is described as an upper side.

First Embodiment

Next, the semiconductor module 1, a manufacturing method thereof, and a mounting body 100 of the semiconductor module 1 according to the first exemplary embodiment will be described with reference to FIGS. 1 to 7. First, the configuration of the semiconductor module 1 according to the present embodiment will be described.

The semiconductor module 1 includes a plurality of dies stacked. As shown in FIG. 1, the semiconductor module 1 includes a first die 11, a second die 12, a third die 13, projecting terminals 14, a mold material 15, the rewiring layer 16, external terminals 17, and a heat dissipating portion 18.

The first die 11 is, for example, a logic chip (MPU). In the present embodiment, the first die 11 has, for example, a rectangular shape when viewed from the front. The first die 11 is disposed with the wiring surface (not shown) downward.

The second die 12 is, for example, a die for power supply. The second die 12 is provided side by side with the first die 11 in a direction intersecting the stacking direction. In the present embodiment, the second die 12 has, for example, a rectangular shape when viewed from the front. Furthermore, in the present embodiment, the second dies 12 are provided in a pair with the first die 11 interposed therebetween in a direction intersecting with the stacking direction. Similarly to the first die 11, the second dies 12 are disposed with the wiring surface (not shown) facing downward. The second dies 12 supply the electric power supplied from the projecting terminals 14 (described later) to third dies 13 (described later).

The third die 13 is DRAM, for example. The third die 13 is disposed across the first die 11 and the second die 12 in the stacking direction. The third die 13 is disposed with the wiring surface (not shown) upward. The third die 13 is electrically connected to the wiring surface of the first die 11 and second die 12 facing. The third die 13 is connected, for example, by connection terminals 141 extending from the respective wiring surfaces of the first die 11 and the second die 12. More specifically, the third die 13 is connected using pillars (Cu pillars) extending from the wiring surfaces of the first die 11 and the second die 12, bumps, or other components. In the present embodiment, the third die 13 includes an array portion 131 and an interface unit 132.

The array portion 131 is a portion of the third die 13, and is a portion where the memory cell array is arranged. In the present embodiment, the array portion 131 is disposed at a position overlapping the second die 12 in the stacking direction. More specifically, the array portion 131 is disposed at a position in the stacking direction where power can be received from the second die 12.

The interface unit 132 is a portion of the third die 13, and is a portion where a memory interface is provided. In the present embodiment, the interface unit 132 is disposed at a position overlapping the first die 11 in the stacking direction. More specifically, the interface unit 132 is disposed at a position in the stacking direction where power can be received from the first die 11. Furthermore, the interface unit 132 is directly connected to the first die 11 via the connection terminals 141 in the stacking direction.

The projecting terminals 14 are each a conductive terminal protruding from the respective wiring surfaces of the first die 11 and the second die 12. The projecting terminals 14 project from a planar region that does not overlap with the third die 13, for example, among the respective wiring surfaces of the first die 11 and second die 12. In other words, the projecting terminals 14 protrude in a spatial region adjacent to at least one side surface of the third die 13 in a direction intersecting the stacking direction. The projecting terminals 14 each have a length which is the same or substantially the same as the height extending from the wiring surface of the first die 11 or the second die 12 to the upper surface of the third die 13. The projecting terminals 14 each serve as a signal line, a power supply line, or a ground line for the first die 11 and second die 12. In the present embodiment, the projecting terminals 14 project from the wiring surfaces of the first die 11 and second die 12 in a spatial region surrounding the four sides of the third die 13.

The mold material 15 is, for example, an epoxy resin. The mold material 15 covers the first die 11, the second die 12, the third die 13, and the projecting terminals 14 in a direction intersecting the stacking direction C.

The rewiring layer 16 is, for example, a layer provided to overlap the projecting terminals 14. The rewiring layer 16 includes conductive wire and vias provided in the interior of the plurality of insulating layers made of, for example, silicon dioxide, silicon nitride, polyimide, or the like. The rewiring layer 16 includes conductive vias 162 which penetrate the rewiring layer 16 and are electrically connected with the projecting terminals 14 in the interior of an insulating layer 161. In the present embodiment, the rewiring layer 16 extends over the end surface in the projecting direction of the projecting terminals 14 and the exposed surface opposite to the wiring surface (not shown) of the third die 13. Furthermore, in the present embodiment, the rewiring layer 16 includes a heat dissipating via 163 for heat dissipation penetrating in the stacking direction C at a position overlapping the third die 13.

The external terminals 17 include, for example, a plurality of bumps, or a plurality of solder balls. The external terminals 17 are provided side by side with each other in the stacking direction C on the rewiring layer 16. In the present embodiment, the external terminals 17 include a connection terminal 171 and a non-connection terminal 172.

The connection terminal 171 is disposed at the exposed position of the conductive vias 162 of the rewiring layer 16. Thus, the connection terminal 171 is electrically connected to the projecting terminals 14 via the rewiring layer 16. The connection terminal 171, for example, functions as a signal terminal, a power supply terminal, or a ground terminal.

The non-connection terminal 172 is disposed at a position overlapping the third die 13 in the stacking direction. The non-connection terminal 172 is not connected to the projecting terminals 14, and functions as a heat dissipating terminal of the third die 13.

The heat dissipating portion 18 is provided for heat dissipation of the third die 13. The heat dissipating portion 18 overlaps the third die 13, and serves as a heat dissipating path of the third die 13. In the present embodiment, the heat dissipating portion 18 includes an overlapping portion 181 overlapping the third die 13 of the rewiring layer 16, and a non-connection terminal 172 of the external terminal 17.

Next, the configuration of the mounting body 100 of the semiconductor module 1 of the present embodiment will be described. The mounting body 100 of the semiconductor module 1 includes the semiconductor module 1, the mounting substrate 101, and the solder balls 102. It should be noted that the mounting body 100 of the semiconductor module 1 includes an underfill 19 for sealing the connection terminal 171 at the position of the connection terminal 171.

The mounting substrate 101 is, for example, an organic substrate. In the present embodiment, the mounting substrate 101 has a larger area than the semiconductor module 1 in a direction intersecting the stacking direction C. The mounting substrate 101 is connected to the connection terminal 171 on one surface. The mounting substrate 101 includes a plurality of through terminals 110 in the stacking direction C. More specifically, the mounting substrate 101 includes therein a through conductive terminal 111 which penetrates in the stacking direction C and is connected to the connection terminal 171, and a through heat dissipating terminal 112 which penetrates in the stacking direction C and is connected to the non-connection terminal 172.

The solder balls 102 are disposed on the other surface of the mounting substrate 101. The solder balls 102 are connected to the through terminal 110.

Next, the operation of the semiconductor module 1 and the mounting body 100 of the semiconductor module 1 of the present embodiment will be described. Power and signals supplied through the through conductive terminal 111 and the connection terminal 171 are supplied to the first die 11 and the second die 12 through the rewiring layer 16 and the projecting terminals 14. The first die 11 operates based on the supplied signal, and also provides power and signals to the interface unit 132 of the third die 13. Furthermore, the second die 12 also supplies power supplied through the projecting terminals 14 to the array portion 131 of the third die 13.

The third die 13 generates heat by electric power supplied from the first die 11 and the second die 12. The heat dissipating unit 18 dissipates the heat generated by the third die 13 to the outside of the mounting substrate 101 via the through heat dissipating terminal 112.

Next, a method of manufacturing the semiconductor module 1 and the mounting body 100 of the semiconductor module 1 will be described. First, the semiconductor module 1 is manufactured. A method of manufacturing a semiconductor module 1 includes: forming the projecting terminals 14 on the first die 11 and the second die 12; providing the first die 11 and the second die 12 side by side on the support substrate 200; providing the third die 13; molding; polishing; forming the rewiring layer 16; providing the external terminal 17; and removing the support substrate 200.

Figure 2:
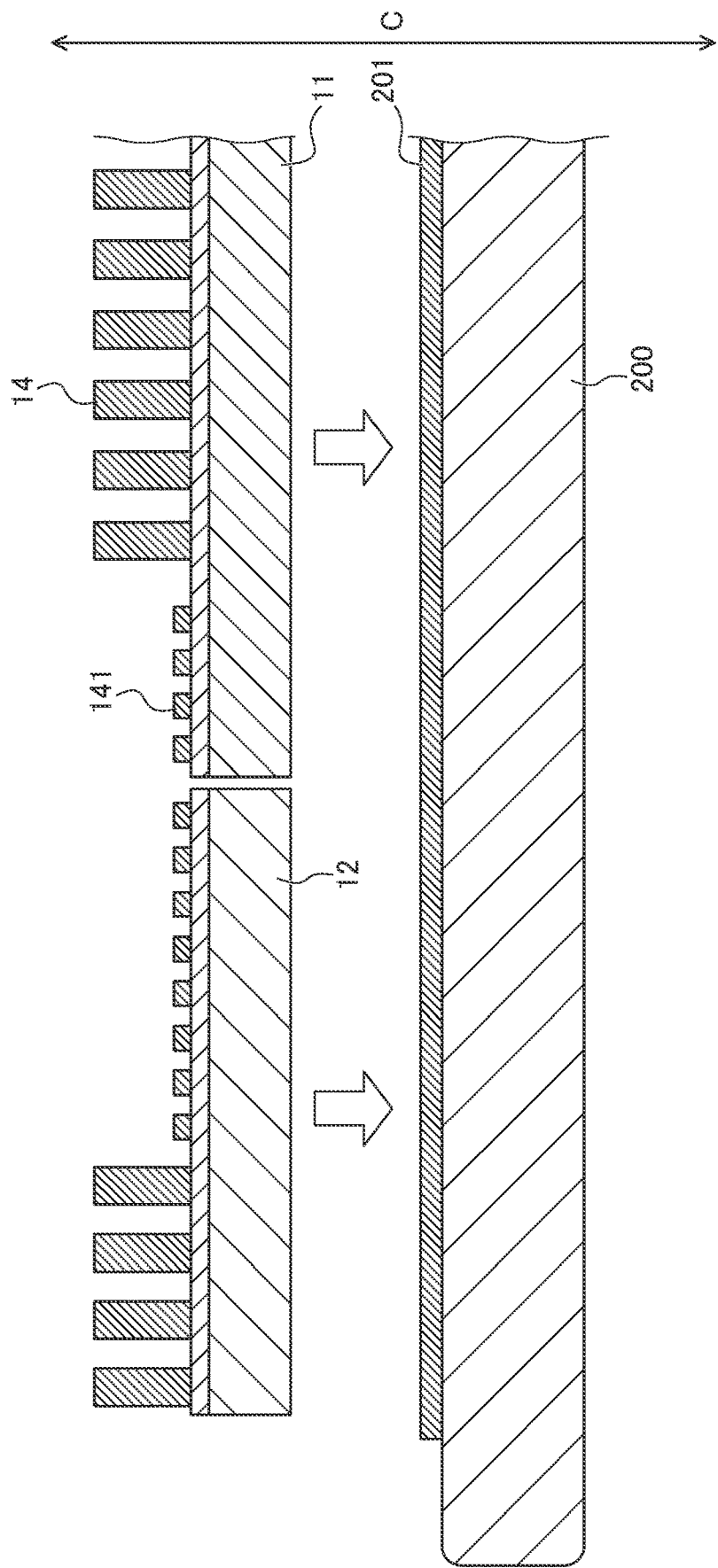
FIG. 2 is a schematic cross-sectional view showing a process of manufacturing the semiconductor module of the first embodiment.

First, the step of forming the projecting terminals 14 on the first die 11 and second die 12 as shown in FIG. 2 is performed. In the step of forming the projecting terminals 14, the projecting terminals 14 are each formed on one surface of the first die 11 and second die 12. The projecting terminals 14 protrude from the wiring surface of the first die 11 and second die 12. Furthermore, the connection terminals 141 between the first die 11 and the third die 13, and between the second die 12 and the third die 13 are formed along with the formation of the projecting terminals 14.

Next, the step of providing the first die 11 and the second die 12 is then performed. The first die 11 and the second die 12 are provided side by side in a direction intersecting the stacking direction C with a surface opposite to the wiring surface on the support substrate 200 via a temporary adhesive layer 201. Here, the support substrate 200 is, for example, a wafer or a panel. In the present embodiment, in the step of providing the first die 11 and the second die 12, a plurality of sets of the first die 11 and the second die 12 are arranged on the support substrate 200.

Figure 3:
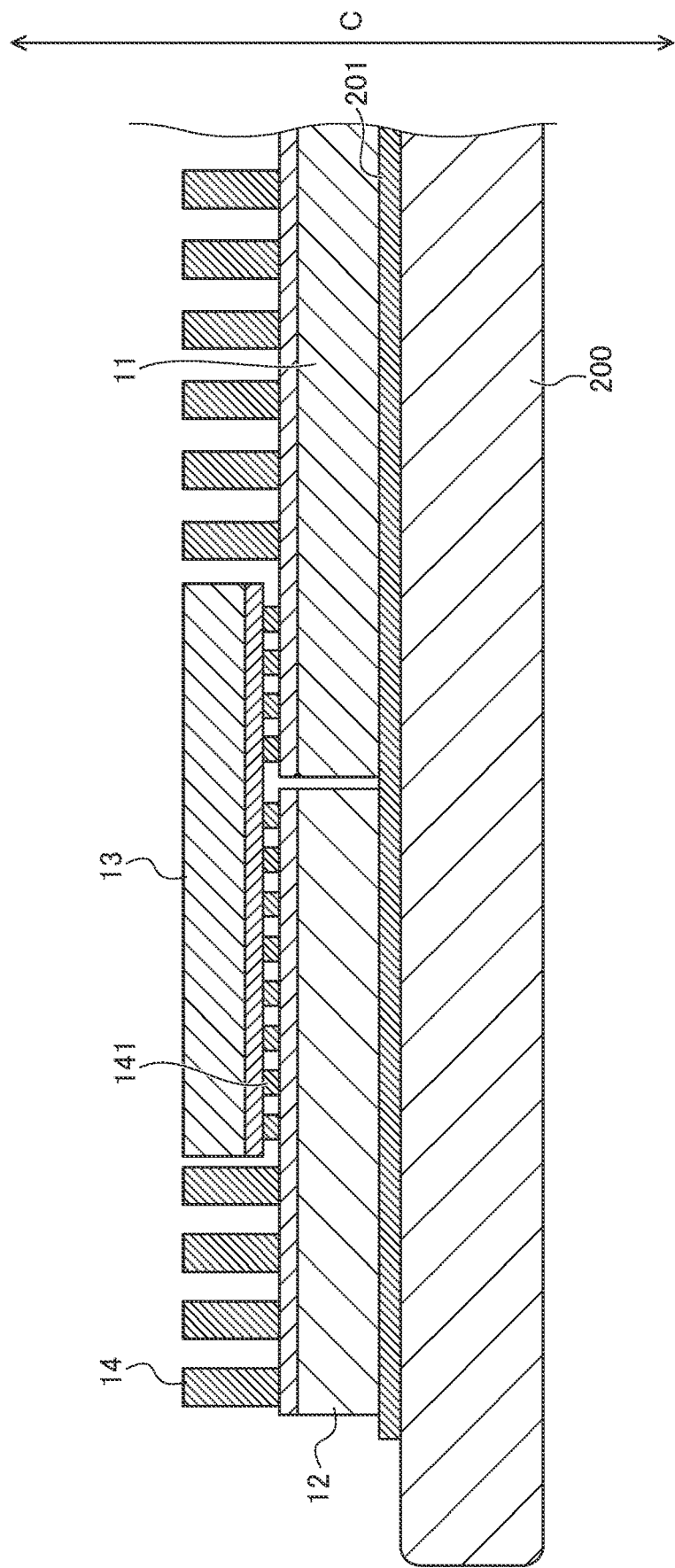
FIG. 3 is a schematic cross-sectional view showing a process of manufacturing the semiconductor module of the first embodiment.
Figure 4:
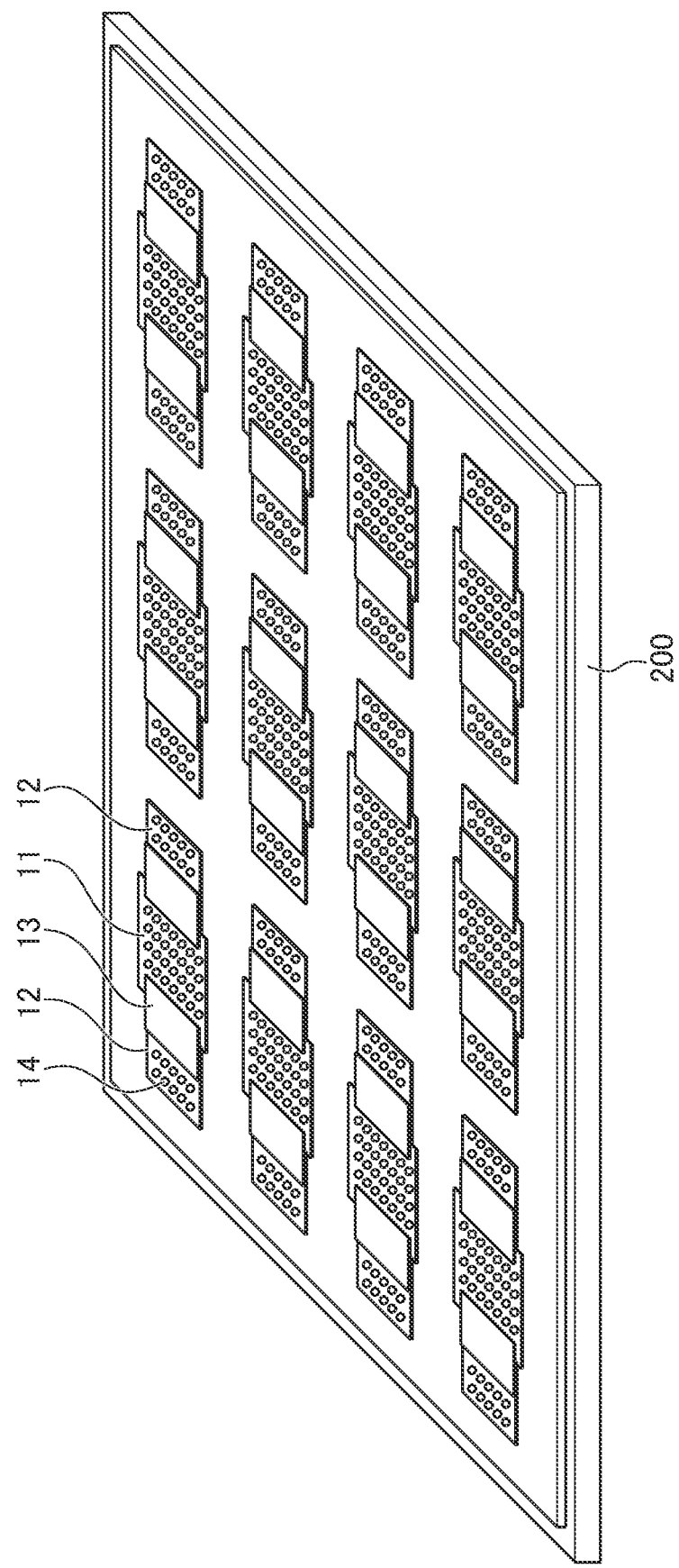
FIG. 4 is a schematic perspective view showing a process of manufacturing the semiconductor module of the first embodiment.

The step of providing the third die 13 is then performed. In the step of providing the third die 13, as shown in FIGS. 3 and 4, the third die 13 extends over the first die 11 and the second die 12. In the step of providing the third die 13, the third die 13 is disposed in the spatial region adjacent to the projecting terminals 14, and is electrically connected to the first die 11 and second die 12 via the connection terminals 141.

The step of molding is then performed. In the molding step, the first die 11, the second die 12, the third die 13, and the projecting terminals 14 are molded by the molding material 15. In the molding step, for example, the first die 11, the second die 12, the third die 13, and the projecting terminals 14 are covered with the molding material 15.

Figure 5:
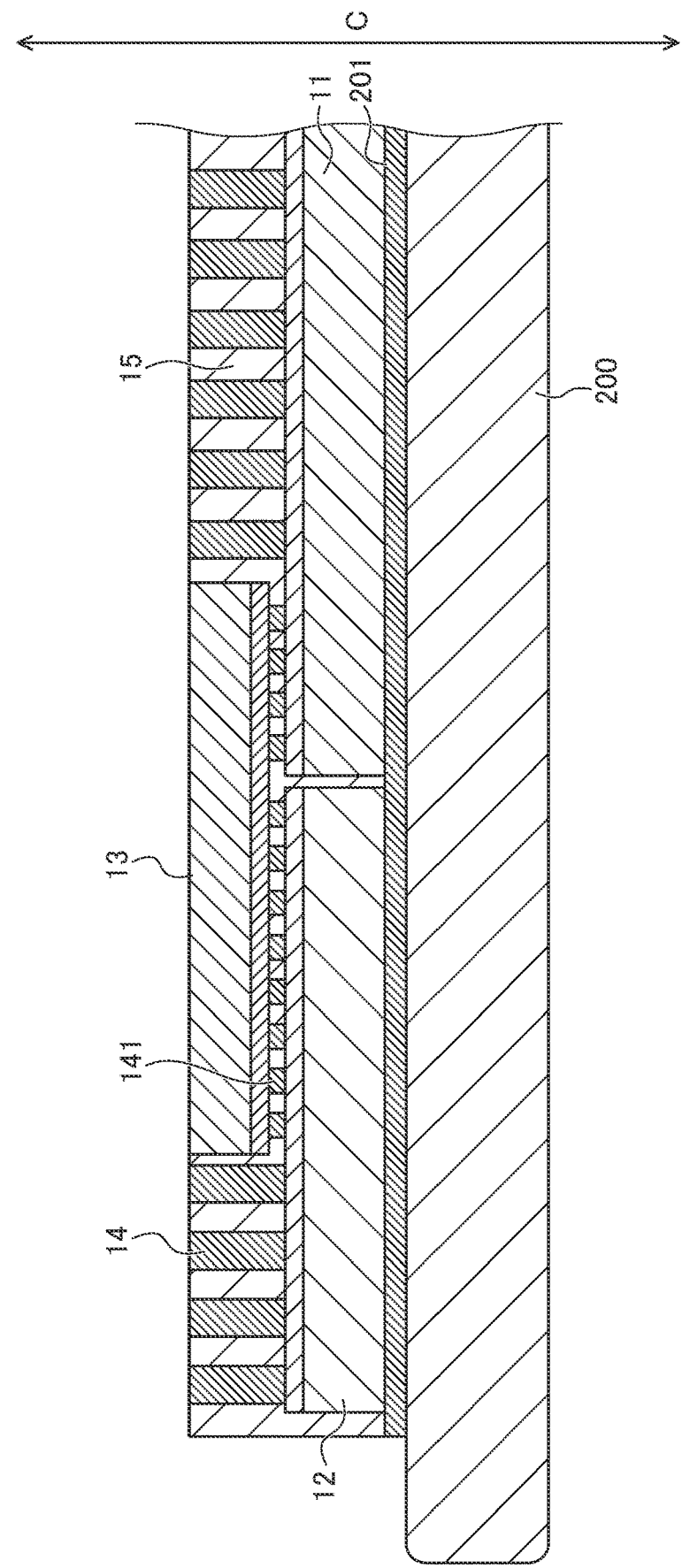
FIG. 5 is a schematic cross-sectional view showing a process of manufacturing the semiconductor module of the first embodiment.

The step of polishing is then performed. In the polishing step, the mold material 15 disposed on the end side in the protruding direction of the third die 13 and the projecting terminals 14 is polished. In the step of polishing, for example, the mold material 15 disposed on the end side in the projecting direction of the projecting terminals 14, and the surface opposite to the wiring surface of the third die 13 are polished using a grinder. As a result, in the polishing step, as shown in FIG. 5, the third die 13 and the projecting terminals 14 are exposed in the stacking direction C.

Figure 6:
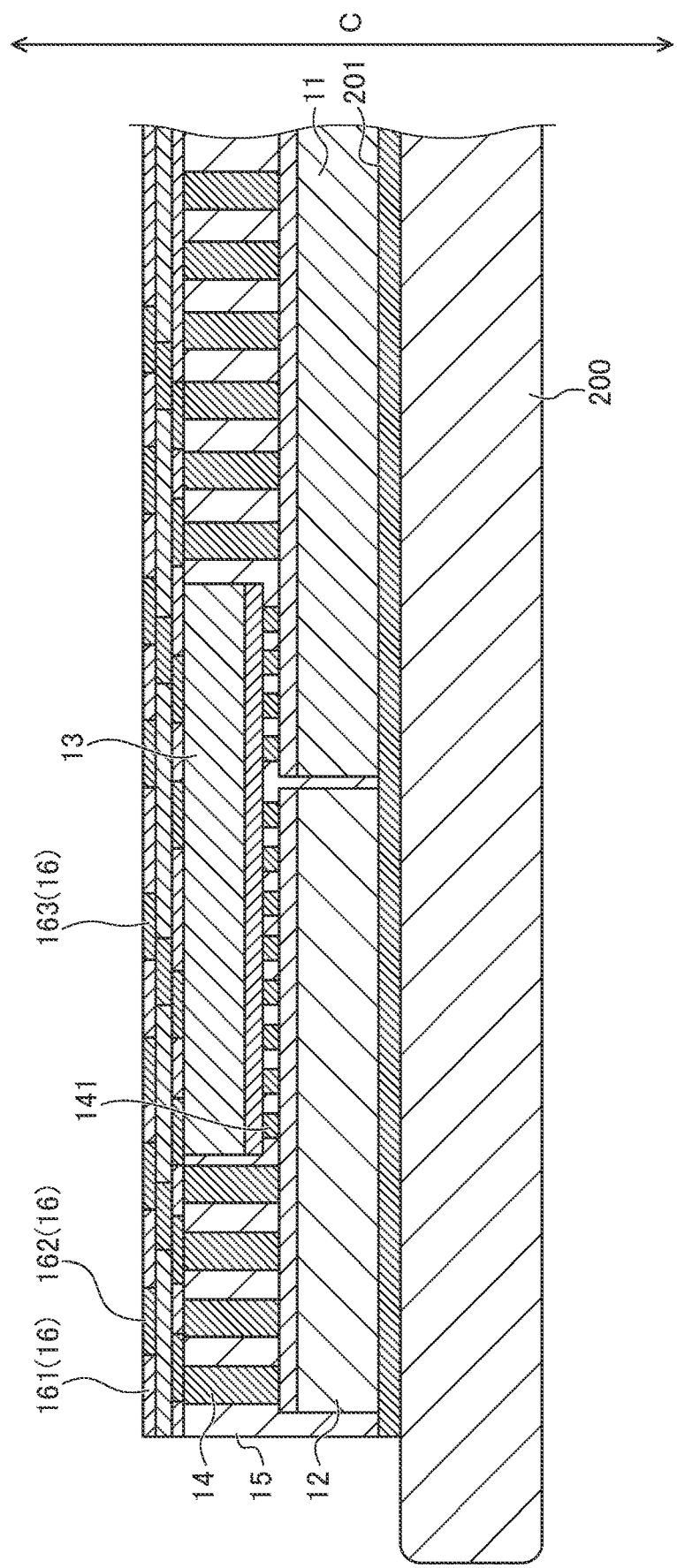
FIG. 6 is a schematic cross-sectional view showing a process of manufacturing the semiconductor module of the first embodiment.

Next, a step of forming the rewiring layer 16 is performed. In the step of forming the rewiring layer 16, the rewiring layer 16 is formed as shown in FIG. 6. In the step of forming the rewiring layer 16, the formation of the insulating layer 161 and the formation of the via are repeated alternately. Thus, the via connected to the projecting terminals 14 is formed.

Figure 7:
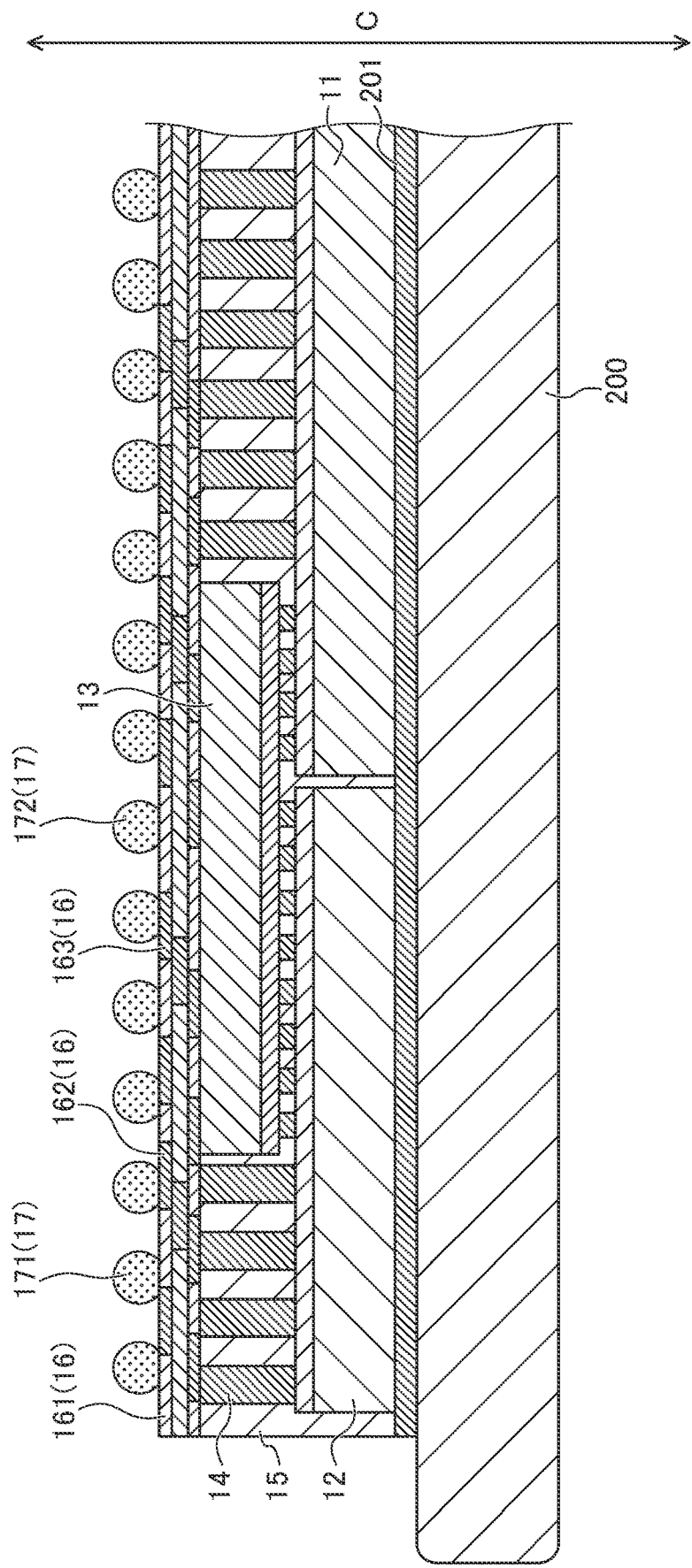
FIG. 7 is a schematic cross-sectional view showing a process of manufacturing the semiconductor module of the first embodiment.

Next, a step of providing the external terminals 17 is performed. By the step of providing the external terminals 17, as shown in FIG. 7, the external terminals 17 are disposed on the exposed surface of the rewiring layer 16. The external terminals 17 are connected to the vias of the rewiring layer 16. More specifically, the connection terminal 171 is disposed at a position overlapping the projecting terminals 14 in the stacking direction C. In addition, the non-connection terminal 172 is disposed at a position overlapping the third die 13.

Next, a step of removing the support substrate 200 is performed. Thus, the semiconductor module 1 is formed.

Next, a method of manufacturing the mounting body 100 of the semiconductor module 1 will be described. The method of manufacturing the mounting body 100 of the semiconductor module 1 includes a step of connecting the mounting substrate 101 and a step of providing the solder balls 102.

First, the step of connecting the mounting substrate 101 is performed. In the step of connecting the mounting substrate 101, one surface of the mounting substrate 101 is connected to the external terminals 17. More specifically, in the step of connecting the mounting substrate 101, the through conductive terminal 111 and the through heat dissipating terminal 112 exposed toward the one surface of the mounting substrate 101 are connected to the external terminals 17. Furthermore, in the step of connecting the mounting substrate 101, the underfill 19 is disposed at the position of the external terminal 17.

Next, a step of providing the solder balls 102 is performed. In the step of providing the solder balls 102, the solder balls 102 are disposed on the other surface of the mounting substrate 101. More specifically, in the step of providing the solder balls 102, the solder balls 102 are disposed in the through conductive terminal 111 and the through heat dissipating terminal 112 exposed from the other surface of the mounting substrate 101.

As described above, the semiconductor module 1, the manufacturing method thereof, and the mounting body 100 of the semiconductor module 1 according to the present exemplary embodiment exhibit the following advantageous effects.

(1) The semiconductor module 1 including a plurality of stacked dies, includes: the first die 11; the second die 12 provided side by side with the first die 11 in a direction intersecting the stacking direction C; the third die 13 that extends over the first die 11 and the second die 12 in the stacking direction C, and is electrically connected to wiring surfaces of the first die 11 and the second die 12 opposite to the third die 13; at least one projecting terminal 14 which projects from the wiring surfaces of the first die 11 and the second die 12, and projects in a spatial region adjacent to at least one side surface of the third die 13 in a direction intersecting the stacking direction C, and a rewiring layer 16 which overlaps the projecting terminal 14. Instead of the conventional package substrate, the semiconductor module 1 is constituted by the rewiring layer 16. As a result, it is possible to reduce cost as compared with the case of using the package substrate. In addition, since the first die 11 and the third die 13 are close to each other and electrically connected to each other, the bandwidth of signals transmitted and received between the first die 11 and the third die 13 can be improved. Furthermore, since the first die 11 and the second die 12 are placed and fixed to the support substrate 200, the alignment accuracy with the third die 13 is improved, and it is possible to increase the number of terminals by narrowing the pitch of the connection terminals 141 with the third die 13.

(2) The second die 12 is a power supply die that supplies the third die 13 with power supplied from the projecting terminal 14. As a result, power can be supplied from the second die 12 as well, so that power can be more stably supplied to the third die 13 as compared with the case where power is supplied from the first die 11 alone to the third die 13.

(3) The second die 12 includes a plurality of second dies 12, and the second dies 12 are provided in a pair with the first die 11 interposed therebetween in a direction intersecting the stacking direction C, and the third die 13 includes a plurality of third dies 13, and the third dies 13 are provided in a pair, each of which extends over the first die 11 and one of the paired second dies 12. As a result, the plurality of third dies 13 can be connected to the first die 11, so that a large capacity can be easily realized.

(4) The third die 13 includes the array portion 131 which overlaps the second die 12 in the stacking direction C, and the interface unit 132 which overlaps the first die 11 in the stacking direction C. Thus, power can be supplied directly from the second die 12 to the array portion 131 which requires more power, while power is supplied from the first die 11, which is a logic chip, to the interface unit 132 which requires less power than the array portion 131. Therefore, power can be supplied more stably than in the case where power is supplied only from the first die 11 to the third die 13. Furthermore, since the interface unit 132 is supplied with power from the first die 11, which is a communication partner, it is possible to improve the signal quality and the matching of the signal voltage level.

(5) The semiconductor module 1 further includes the heat dissipating portion 18 that overlaps the third die 13, and serves as a heat dissipating path of the third die 13. As a result, the heat dissipation portion 18 corresponding to the third die 13 disposed in the vicinity of the substrate 101 can be formed, so that the third die 13 can be operated more stably.

(6) The semiconductor module 1 further includes the plurality of external terminals 17 provided side by side with the rewiring layer 16 in the stacking direction C, the plurality of external terminals 17 including the connection terminal 171 which is electrically connected to the projecting terminal 14 via the rewiring layer 16, and the non-connection terminal 172 which is provided at a position overlapping the third die 13 in the stacking direction C and is not electrically connected to the projecting terminal 14. Thus, it is possible to similarly provide the connection terminal 171 and the non-connection terminal 172 on the rewiring layer 16. Therefore, it is possible to reduce the manufacturing cost while providing the heat dissipating portion 18 to the semiconductor module 1.

(7) The heat dissipating portion 18 includes the overlapping portion 181, which overlaps the third die 13, of the rewiring layer, and the non-connection terminal 172. Thus, it is possible to also serve as a configuration of wiring and heat dissipation in the rewiring layer 16 and the external terminal 17. Therefore, it is possible to reduce the cost of manufacturing the semiconductor module 1.

(8) The mounting body 100 of the semiconductor module 1 includes the semiconductor module 1 according to the above configuration, and the mounting substrate 101 including the plurality of through terminals 110 penetrating in the stacking direction C and each connected to at least one external terminal 17. Thus, the semiconductor module 1 can be easily mounted on a substrate such as a motherboard.

(9) The method of manufacturing the semiconductor module 1 including a plurality of stacked dies, the method including the steps of: forming at least one projecting terminal 14 on one surface of each of the first die 11 and the second die 12; providing the first die 11 and the second die 12 side by side on the support substrate 200; providing the third die 13 so as to extend over the first die 11 and the second die 12; molding the first die 11, the second die 12, the third die 13, and the projecting terminal 14; forming the rewiring layer 16 which extends over an exposed surface of the third die 13, and is electrically connected to the projecting terminal 14; and removing the support substrate 200. Thus, it is possible to form the semiconductor module 1 using the rewiring layer 16, so that it is possible to reduce the manufacturing cost of the semiconductor module 1.

(10) The step of providing the first die 11 and the second die 12 side by side on the support substrate 200 further includes the step of providing a plurality of sets of the first die 11 and the second die 12. Thus, as compared with the case of forming the semiconductor module 1 for each package substrate, a plurality of semiconductor modules 1 can be manufactured at a time. Therefore, it is possible to reduce the manufacturing cost of the semiconductor module 1.

(11) The method of manufacturing the semiconductor module 1 further includes the step of polishing to cause the third die 13 and the projecting terminal 14 to be exposed, after the step of molding before the step of forming the rewiring layer 16. Therefore, after molding, it is possible for the tip in the protruding direction of the projecting terminals 14, and the exposed surface of the third die 13 to have the same or substantially the same height. Therefore, it is possible to facilitate the formation of the rewiring layer 16 which is electrically connected to the projecting terminals 14, such that it is possible to reduce the manufacturing cost of the semiconductor package 100.

Second Embodiment

Next, a semiconductor module 1, a manufacturing method thereof, and a mounting body 100 of the semiconductor module 1 according to a second exemplary embodiment of the present disclosure will be described with reference to FIG. 8. In the description of the second embodiment, the same components as those of the above-described embodiment are denoted by the same reference numerals, and the descriptions thereof are omitted or simplified. The semiconductor module 1 according to the second embodiment differs from the first embodiment in the configuration of the overlapping portion 181 of the heat dissipating portion 18.

Figure 8:
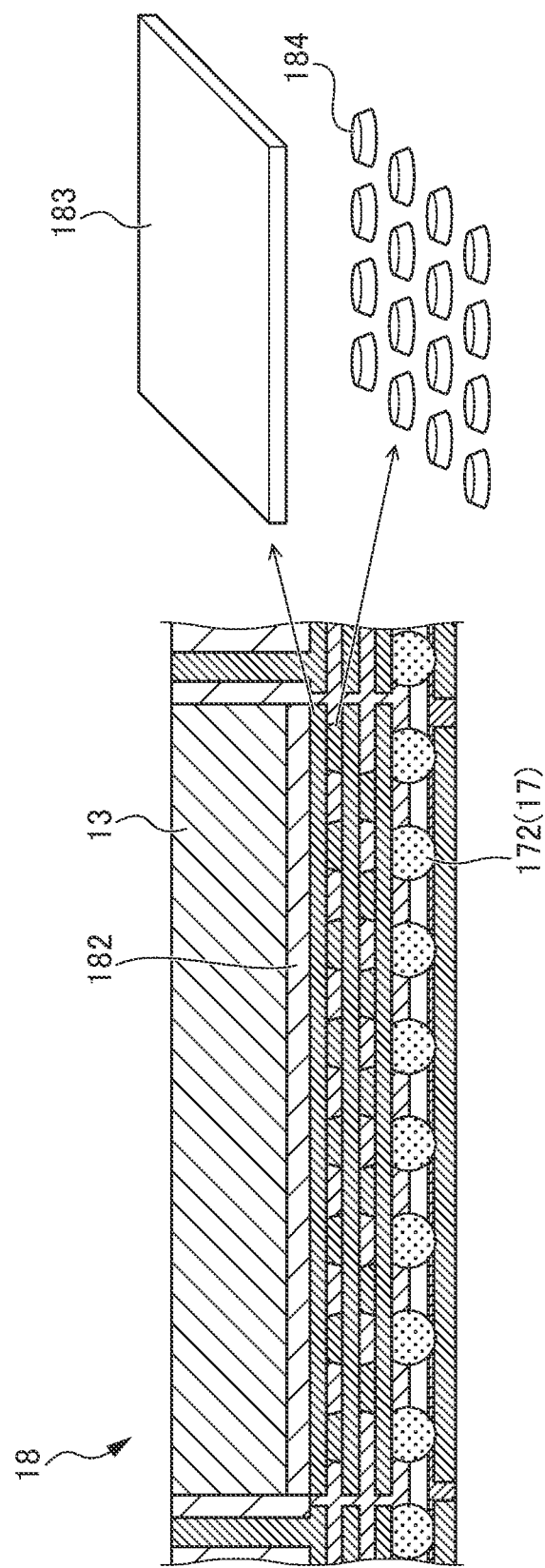
FIG. 8 is a schematic configuration diagram showing a heat dissipating portion of the semiconductor module of the second exemplary embodiment of the present disclosure.
Figure 9:
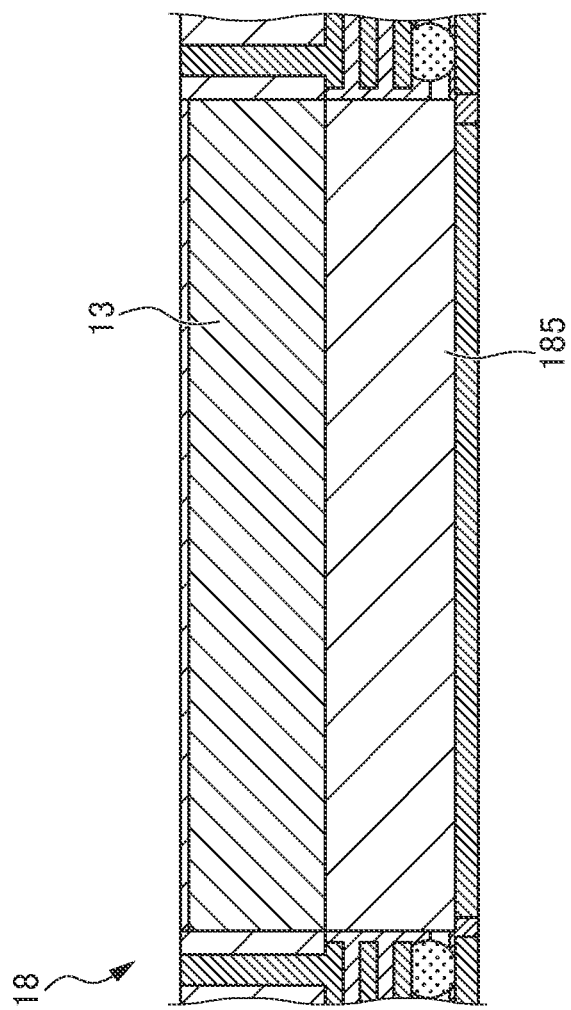
FIG. 9 is a schematic sectional view showing a heat dissipating portion of the semiconductor module of the third exemplary embodiment of the present disclosure.

As shown in FIG. 8, the overlapping portion 181 includes at least one metal layer 183, an insulating layer 161, and heat dissipating vias 184. The overlapping portion 181 is disposed on the third die 13 through a die attach material 182 for heat dissipation in the stacking direction C.

The metal layer 183 is, for example, a copper layer, and is discontinuously disposed in the stacking direction C. For example, the metal layer 183 is provided alternately with the insulating layer 161 to be described later along the stacking direction C. In the present embodiment, the metal layer 183 has, for example, a rectangular shape in a front view, and has the same size or substantially the same size as the overlapping surface of the third die 13 in the stacking direction C.

The insulating layer 161 is, for example, a layer made of silicon dioxide, silicon nitride, polyimide, or the like. The insulating layer 161 is provided alternately with the metal layer 183 along the stacking direction C.

The heat dissipating vias 184 are each a via penetrating the insulating layer 161. The heat dissipating vias 184 connect the metal layer 183 in the stacking direction C. In the present embodiment, the heat dissipating vias 184 are arranged in a matrix in a front view. Thus, even if the overlapping portion 181 is expanded by heat, it is possible to improve the stability of the semiconductor module 1 as compared with the case where the entire overlapping portion 181 serves as the metal layer 183.

As described above, the semiconductor module 1, the manufacturing method thereof, and the mounting body 100 of the semiconductor module 1 according to the present embodiment exhibit the following advantageous effects.

(12) The overlapping portion 181 includes metal layers 183 stacked discontinuously, and at least one heat dissipating via 184 connecting between the metal layers 183 which are adjacent. Thus, it is possible to increase the stability against expansion due to heat of the overlapping portion 181 as well as improving the heat dissipation efficiency of the third die 13.

Third Embodiment

Next, a semiconductor module 1, a manufacturing method thereof, and a mounting body 100 of the semiconductor module 1 according to a third exemplary embodiment of the present disclosure will be described with reference to FIG.

9. In the description of the third embodiment, the same components as those of the above-described embodiments are denoted by the same reference numerals, and the descriptions thereof are omitted or simplified. The semiconductor module 1 according to the third embodiment differs from the first embodiment and the second embodiment in that the heat dissipating portion 18 includes a heat dissipating member 185 instead of the overlapping portion 181. Accordingly, the rewiring layer 16 is provided so as to penetrate a position overlapping the third die 13. Furthermore, the method of manufacturing the semiconductor module 1 according to the third embodiment differs from the first embodiment and the second embodiment in that it further includes a step of providing the heat dissipating member 185.

The heat dissipating member 185 may be, for example, a die attaching material 182 for heat dissipation. The heat dissipating member 185 is disposed between one surface of the mounting substrate 101 and the surface opposite to the wiring surface of the third die 13 in the stacking direction C. More specifically, the heat dissipating member 185 is disposed in contact with one surface of the mounting substrate 101 and the surface opposite to the wiring surface of the third die 13 in the stacking direction C.

In the step of providing the heat dissipating member 185, the heat dissipating member 185 penetrating the rewiring layer 16 is disposed at a position overlapping the third die 13. The step of providing the heat dissipating member 185 is performed after the step of polishing.

As described above, the semiconductor module 1, the manufacturing method thereof, and the mounting body 100 of the semiconductor module 1 according to the present embodiment exhibit the following advantageous effects.

(13) The heat dissipating portion 18 includes the heat dissipating member 185 penetrating the rewiring layer 16. Thus, it is possible to transfer the heat generated in the third die 13 to the mounting substrate 101 via the heat dissipating member 185. It is possible to place the heat dissipating member 185 on the entire position overlapping the surface opposite to the wiring surface of the third die 13 in the direction along the stacking direction C, such that it is possible to further improve the heat dissipation efficiency.

(14) The method of manufacturing the semiconductor module 1 further includes the step of providing the heat dissipating member 185 penetrating the rewiring layer 16 at a position overlapping the third die 13. Since it is only necessary to simply place the heat dissipating member 185 at a position overlapping the third die 13 where the rewiring layer 16 is not provided, it is possible to further reduce the manufacturing cost of the semiconductor module 1.

Figure 10:
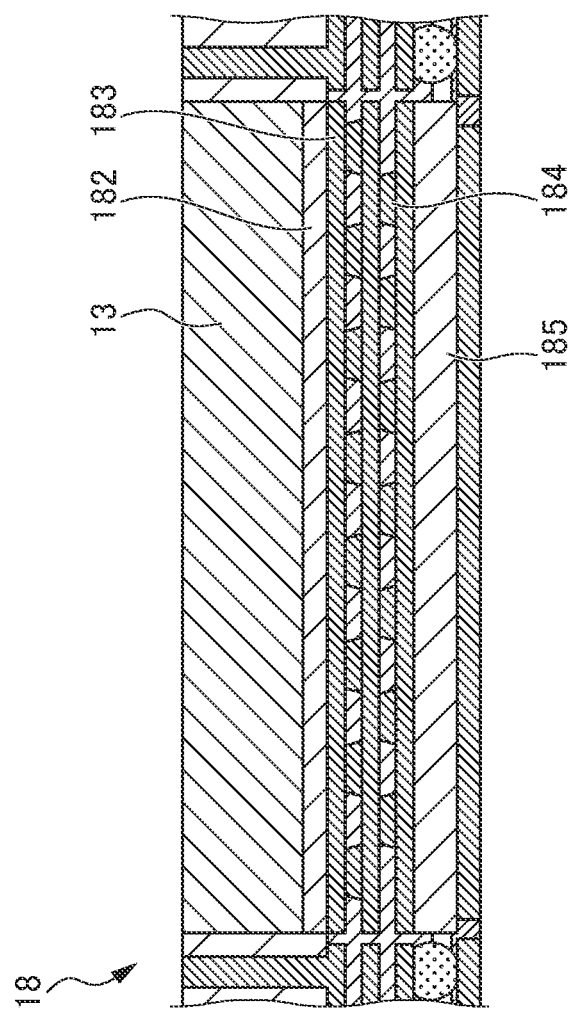
FIG. 10 is a schematic sectional view showing a heat dissipating portion of the semiconductor module according to a modification example of the present disclosure.

Although each preferred embodiment of the semiconductor module, the manufacturing method thereof, and the mounting body of the semiconductor module of the present disclosure have been described above, the present disclosure is not limited to the exemplary embodiments described above, and can be modified as appropriate. For example, in the second exemplary embodiment, as shown in FIG. 10, the heat dissipating member 185 may be disposed instead of the non-connection terminal 172. By using the heat dissipating member 185, since the area in contact with the overlapping layer becomes larger than the case of using the non-connection terminal 172, it is possible to improve the heat dissipation efficiency.

In the above exemplary embodiments, the first die 11 is a logical chip and the third die 13 is a DRAM chip; however, the first die 11 may be a DRAM chip and the third die 13 may be a logical chip. That is, one DRAM may be connected to a plurality of logical chips. Furthermore, one DRAM may be, for example, an interface chip. That is, one interface chip may be connected to a plurality of logic chips.

Furthermore, in the above-described embodiments, the first die 11 may be widely applied to logical chips overall. In addition, the third die 13 is not limited to DRAM, and may be widely applied to RAM (Random Access Memory) including a non-volatile RAM (for example, MRAM, ReRAM, FeRAM, etc.).

EXPLANATION OF REFERENCE NUMERALS 1 semiconductor module
11 first die
12 second die
13 third die
14 projecting terminal
16 rewiring layer
17 external terminal
18 heat dissipating portion
100 mounting body of a semiconductor module
101 mounting substrate
102 solder balls
110 through terminal
131 array portion
132 interface unit
171 connection terminal
172 non-connection terminal
181 overlapping portion
183 metal layer
184 heat dissipating vias
185 heat dissipating member
200 support substrate
C stacking direction

The invention claimed is:

1. A semiconductor module including a plurality of stacked dies, comprising:
   a first die;
   a second die provided side by side with the first die in a direction intersecting a stacking direction;
   a third die that extends over the first die and the second die in the stacking direction, and is electrically connected to wiring surfaces of the first die and the second die opposite to the third die;
   at least one projecting terminal which projects from the wiring surfaces of the first die and the second die, and projects in a spatial region adjacent to at least one side surface of the third die in a direction intersecting the stacking direction; and
   a rewiring layer which overlaps the projecting terminal, wherein the third die comprises:
   an array portion which overlaps the second die in the stacking direction, and
   an interface unit which overlaps the first die in the stacking direction.

2. The semiconductor module according to claim 1, wherein the second die is a power supply die that supplies the third die with power supplied from the projecting terminal.

3. A semiconductor module including a plurality of stacked dies, comprising:
   a first die;
   a second die provided side by side with the first die in a direction intersecting a stacking direction;
   a third die that extends over the first die and the second die in the stacking direction, and is electrically connected to wiring surfaces of the first die and the second die opposite to the third die;

at least one projecting terminal which projects from the wiring surfaces of the first die and the second die, and projects in a spatial region adjacent to at least one side surface of the third die in a direction intersecting the stacking direction; and a rewiring layer which overlaps the projecting terminal, wherein the second die comprises a plurality of second dies, and the second dies are provided in a pair with the first die interposed therebetween in a direction intersecting the stacking direction, and the third die comprises a plurality of third dies, and the third dies are provided in a pair, each of which extends over the first die and one of the paired second dies, the first die has a connection terminal extending from the wiring surface in the stacking direction, and the third die is directly connected to the first die via the connection terminal.

4. The semiconductor module according to claim 1, further comprising a heat dissipating portion that overlaps the third die, and serves as a heat dissipating path of the third die.

5. The semiconductor module according to claim 4, further comprising a plurality of external terminals provided side by side with the rewiring layer in the stacking direction, the plurality of external terminals including a connection terminal which is electrically connected to the projecting terminal through the rewiring layer, and a non-connection terminal which is provided at a position overlapping the third die in the stacking direction and is not electrically connected to the projecting terminal.

6. The semiconductor module according to claim 5, wherein the heat dissipating portion includes an overlapping portion, which overlaps the third die, of the rewiring layer, and the non-connection terminal.

7. The semiconductor module according to claim 6, wherein the overlapping portion comprises:

metal layers stacked discontinuously, and at least one heat dissipating via connecting between the metal layers which are adjacent.

8. The semiconductor module according to claim 4, wherein the heat dissipating portion includes a heat dissipating member penetrating the rewiring layer.

9. A mounting body of a semiconductor module, comprising:

a semiconductor module according to claim 3, and a mounting substrate including a plurality of through terminals penetrating in the stacking direction and each connected to at least one external terminal.

* * * * *